United States Patent
Goishi

(10) Patent No.: US 7,336,714 B2
(45) Date of Patent: Feb. 26, 2008

(54) PHASE ADJUSTMENT APPARATUS AND SEMICONDUCTOR TEST APPARATUS

(75) Inventor: Masaru Goishi, Tokyo (JP)

(73) Assignee: Advantest Corporation, Tokyo (JP)

( * ) Notice: Subject to any disclaimer, the term of this patent is extended or adjusted under 35 U.S.C. 154(b) by 676 days.

(21) Appl. No.: 10/850,048

(22) Filed: May 20, 2004

(65) Prior Publication Data

US 2005/0053162 A1 Mar. 10, 2005

Related U.S. Application Data

(63) Continuation of application No. PCT/JP02/12121, filed on Nov. 20, 2002.

(30) Foreign Application Priority Data

Nov. 20, 2001 (JP) .............................. 2001-354222

(51) Int. Cl.
*H03H 7/30* (2006.01)
(52) U.S. Cl. ..................................................... 375/259
(58) Field of Classification Search ................ 375/295, 375/259, 354, 371; 327/141
See application file for complete search history.

(56) References Cited

U.S. PATENT DOCUMENTS

| 5,081,655 A | 1/1992 | Long ........................... 375/119 |
| 6,125,157 A * | 9/2000 | Donnelly et al. ............ 375/371 |
| 6,977,979 B1 * | 12/2005 | Hartwell et al. ............. 375/354 |

FOREIGN PATENT DOCUMENTS

| JP | 09-247140 | 9/1997 |
| JP | 11-355130 | 12/1999 |
| JP | 11-355258 | 12/1999 |
| JP | 2000-101554 | 4/2000 |
| JP | 2000-151372 | 5/2000 |
| JP | 2000-196571 | 7/2000 |

OTHER PUBLICATIONS

Patent Abstracts of Japan, publication No. 2000-196571, publication date Jul. 14, 2000, 1 page.

(Continued)

*Primary Examiner*—David C. Payne
*Assistant Examiner*—Leon Flores
(74) *Attorney, Agent, or Firm*—Osha Liang LLP

(57) ABSTRACT

A phase adjustment apparatus and a semiconductor test apparatus for automatically correcting irregularities of propagation delay of a transmission signal, so that the transmission signal transmitted between apparatuses while synchronized with a high-speed clock can be received at a stable optimal timing at a receiving end. The phase adjustment apparatus for transmitting a transmission signal synchronized with a clock between a first apparatus of the sending end and a second apparatus of the receiving end includes phase adjustment means used when retiming the transmission signal with the clock of the receiving end of the second apparatus. That is, the phase adjustment means corrects an unknown phase relationship between the clock of the receiving end and the transmission signal and delays the transmission signal by a specified amount for adjustment so that the signal can be received with a stable retiming condition.

4 Claims, 6 Drawing Sheets

OTHER PUBLICATIONS

Patent Abstracts of Japan, publication No. 2000-101554, publication date Apr. 7, 2000, 1 page.
Patent Abstracts of Japan, publication No. 09-247140, date of publication Sep. 19, 1997, 1 page.
Patent Abstracts of Japan, publication No. 2000-151372, date of publication May 30, 2000, 1 page.
Patent Abstracts of Japan, publication No. 11-355258, publication date Dec. 24, 1999, 1 page.
Patent Abstracts of Japan, publication No. 11-355130, publication date Dec. 24, 1999.
International Search Report, dated Feb. 18, 2003, 3 pages.

* cited by examiner

PHASE ADJUSTMENT APPARATUS AND SEMICONDUCTOR TEST APPARATUS

The present application is a continuation application of PCT/JP02/12121 filed on Nov. 20, 2002 which claims priority from Japanese patent application No. 2001-354222 filed on Nov. 20, 2001, the entire contents of which are incorporated herein by reference for all purposes.

BACKGROUND OF THE INVENTION

1. Field of the Invention

The present invention relates to a phase adjustment apparatus of a transmission signal transmitted between apparatuses while synchronized with a clock and a semiconductor test apparatus using the phase adjustment apparatus. More particularly, the present invention relates to a phase adjustment apparatus and a semiconductor test apparatus for automatically correcting irregularities of propagation delay of a transmission signal transmitted between apparatuses while synchronized with a high-speed clock, so that the transmission signal can be received at stable and optimal timing in a receiving end.

2. Related Art

FIG. 6 shows the representative schematic configuration of a semiconductor test apparatus. The main configuration elements include a timing generator TG, a pattern generator PG, a waveform formatter FC, a pin electronics PE, a logic comparator DC, and a fail memory FM. Here, since the semiconductor test apparatus is publicly known and it is technically well known, each configuration element will not be described in detail.

In the mean time, as the signals transmitted between those elements while being synchronized with a clock, there are thousands of pieces of pattern data PAT, hundreds of expected values EXP, a fail signal FD, an address signal AD, etc., and the units are coupled to each other with cables of few meters which is relatively long. In addition, the signals are mainly transmitted in the form of a differential transmission signal. And with regard to the inside of each unit, there are lots of circuit parts where signals are transmitted between the circuits or LSIs with a high-speed clock. With regard to all of those signals, although there are temperature change, time lapse, board replacement, etc., it is necessary for the signals to be stably transmitted between the apparatuses or circuits while synchronized with a clock.

FIG. 1 shows a configuration example of a conventional phase adjustment apparatus of a transmission signal for performing a phase adjustment of timing for a clock. Further, although the transmission signals in the semiconductor test apparatus may exist in large numbers and the clocks may be applied at different timing, it is herein simply assumed that one transmission signal is received and retiming is performed on the signal with a clock.

These main configuration elements includes a first clock CLK1, a second clock CLK2, a first apparatus 100, a connection line 300, a delay device 80, and a second apparatus 200.

The first and second clocks CLK1 and CLK2 are high-speed clocks of a same period, e.g. clocks of 500 MHz (2 nano seconds in period), where there is an undetermined phase difference of a few hundreds pico seconds, which is to be inputted in a timing state regulated to some degree, between the phases at the input terminals of both apparatuses. Further, the first and second clocks CLK1 and CLK2 are common clocks which are supplied to other circuits, a transmission unit or a reception unit, and the phase adjustment apparatus generally includes a clock buffer circuit (not shown) for distributing the clocks.

The first and second apparatuses 100 and 200 may be individual boards or units, or may be an LSI inside a same board. Particularly, it is herein assumed that they are LSIs built in a same board.

The first apparatus 100 includes an internal circuit 10 and a transmission unit 110 therein. The transmission unit 110 includes a flip-flop 20 as an example of principle configuration. A transmission signal 20s which results from performing retiming of an input signal 10s of the input terminal of the flip-flop 20 with the first clock CLK1 is outputted, passed through the connection line 300 and the delay device 80, and supplied to the second apparatus 200.

The connection line 300 is a pattern wiring between both the LSIs. The amount of the propagation delay caused by a pattern is different due to the conductivity of the material of a board, the thickness of a multi-layer board, as well as the inner layer and surface layer of a multi-layer board, e.g. is 1 nano-second more or less for 10 cm.

It is practically difficult to match all of the lengths of the pattern wirings of thousands of transmission signals which connect both the LSIs or the amounts of the propagation delay. For example, if the lengths of the pattern wirings are different by 1 cm, the difference between the amounts of the propagation delay becomes 0.1 nano second more or less. Further, although the lengths of the lines are the same, the amounts also vary due to the difference of the wiring patterns across the inner or surface layer of the multi-layer board actually manufactured or the difference of the number of via holes crossing. And there is also jitter or waveform distortion caused by the reflection of the transmission signal.

The delay device 80 is semi-fixed delay means. In other words, a fixed delay device of a desired delay amount is optionally mounted, whereby it outputs the delay signal 80s which has been delayed to some extent from the transmission signal 20s received. Therefore, the reception unit 210 of the second apparatus 200 can perform retiming of the transmission signal 20s with the second clock CLK2 under a timing condition whose set-up time or hold time is stable.

The reception unit 210 of the second apparatus 200 includes a flip-flop 82 which receives the delay signal 80s and supplies the retiming signal 82s on which retiming has been performed with the second clock CLK2 to the internal circuit 90.

According to the above conventional configuration, for the stable retiming condition, it is necessary to finally attach the delay device 80 whose delay amount is 0.1 to 1.0 nano second more or less after performing replacing adjustment. In addition, there is a difficulty that it takes time for adjustment work to adjust the fixed delay device of a desired delay amount while selecting it. And there is also a difficulty that in response to tens or hundreds of transmission signals, an area is needed to mount a lot of the delay devices 80 on a board, so the mounting density of the board decreases.

And if the delay characteristics of the transmission unit 110 or the reception unit 210 of a built-in LSI changes, or the clock timing of the first or second clock CLK1 or CLK2 is changed in design, the delay amount of the delay device 80 previously obtained cannot be applied, and it needs to be adjusted again.

According to board replacement or cable replacement, it is necessary to care about the clock timing of the first or second clock CLK1 or CLK2 not to change. If it changes, there is a problem that the retiming operation in accordance with this becomes unstable.

In the above conventional art, it is necessary to adjust the delay amount of the delay device 80 and attach it for each transmission signal 20s. In addition, if the timing condition under which retiming is performed on the transmission signal 20s changes due to the board replacement, there might occur some of lots of transmission signals which are not necessarily in the stable timing state. And there is also manufacture irregularity in an IC or LSI itself or irregularity of propagation delay according to the difference of makers, whereby the timing does not always be in the optimal retiming state. And jitter or waveform distortion caused by reflection of the transmission signal also exits. According to this, if a high-speed clock whose operation margin is narrow is applied, there is a possibility that a malfunction is occasionally caused unless the optimal phase condition is set.

And since the propagation delay amount of a semiconductor IC is dependent upon temperature, a change in the propagation delay amount of the transmission unit, the reception unit, or a clock distribution circuit occurs, so the retiming condition might deviate from the stable state.

And in case of changing the period of a clock, the phase relation between the transmission signal received and the clock of the receiving end in which retiming is performed on the signal does not be in the optimal phase condition.

And as the power supply voltage condition or the surrounding temperature changes or time lapses, the retiming condition gets gradually out of the stable state.

In operation with the power source being supplied, it is often uncertain whether the apparatus is operating while maintaining the retiming state which was stable under the present power supply voltage condition and the surrounding temperature condition or not.

In terms of that point, the conventional art has a practical problem which is not desirable.

SUMMARY OF THE INVENTION

Accordingly, it is an object of the present invention to provide a phase adjustment apparatus and a semiconductor test apparatus for automatically correcting irregularities of propagation delay of a transmission signal transmitted between apparatuses while synchronized with a high-speed clock, so that the transmission signal can be received at stable and optimal timing in a receiving end.

In addition, it is an object of the present invention to provide a phase adjustment apparatus and a semiconductor test apparatus for automatically correcting irregularities of propagation delay of a transmission signal, so that the transmission signal can be received at stable and optimal timing in a receiving end, even if the phase relation between the transmission signal received and a clock of the receiving end in which retiming is performed on the signal is in the unknown state.

In addition, it is an object of the present invention to provide a phase adjustment apparatus and a semiconductor test apparatus for automatically correcting irregularities of propagation delay at the time of present operation, so that the retiming state which was most stable can be maintained under the present power supply voltage condition and the surrounding temperature condition in the operation state with a power source being supplied.

In addition, it is an object of the present invention to provide a phase adjustment apparatus and a semiconductor test apparatus for automatically correcting the phase relation of retiming, so that the signal can be received at stable and optimal timing, even in case of changing the period of a clock.

The first means for achieving the above objects will be shown.

In order to solve the above problems, a phase adjustment apparatus for transmitting a transmission signal synchronized with a clock between a first apparatus of a sending end and a second apparatus of a receiving end includes phase adjustment means for adjusting a phase by correcting an unknown phase relation between a clock of the receiving end and the transmission signal and delaying the transmission signal by a specified amount in order that the signal can be received under a stable and optimal timing condition, when retiming is performed on the transmission signal with the clock of the receiving end of the second apparatus.

According to this invention, it is possible to realize a phase adjustment apparatus and a semiconductor test apparatus for automatically correcting irregularities of propagation delay of a transmission signal transmitted between apparatuses while synchronized with a high-speed clock, so that the transmission signal can be received at stable and optimal timing in a receiving end.

Next, the second means for achieving the above objects will be shown.

In order to solve the above problems, a phase adjustment apparatus for transmitting a transmission signal synchronized with a clock between a first apparatus of a sending end and a second apparatus of a receiving end includes phase adjustment means for adjusting a phase by correcting an unknown phase relation between a clock of the receiving end and the transmission signal with regard to a present operation state (e.g. a power supply, surrounding temperature, clock phase condition) and delaying the transmission signal by a specified amount in order that the signal can be received under a stable and optimal timing condition, when retiming is performed on the transmission signal with the clock of the second apparatus of the receiving end.

Next, the third means for achieving the above objects will be shown.

In order to solve the above problems, a phase adjustment apparatus for transmitting a transmission signal synchronized with a clock between a first apparatus of a sending end and a second apparatus of a receiving end includes phase adjustment means for adjusting a phase of the transmission signal by correcting an unknown phase relation between a clock of the receiving end and the transmission signal and by performing a delay process of automatically adjusting the phase of the transmission signal by a specified amount in order that the signal can be received under a stable and optimal timing condition, when retiming is performed on the transmission signal with the clock of the second apparatus of the receiving end.

Next, the fourth means for achieving the above objects will be shown.

In an aspect of the phase adjustment means, it includes variable delay means 50 for receiving the transmission signal to be received and outputting a delayed pulse signal 50s delayed by a specified amount, a flip-flop 60 for performing retiming of the delayed pulse signal 50s received via the variable delay means 50 with the clock of the receiving end, phase detection means (e.g. an XOR gate 62) for receiving the delayed pulse signal 50s and a retiming signal 60s, which is an output of the flip-flop 60, and detecting the present phase relation, and a counter 64 of an UP/DWN type for counting up or down based on the phase detection means, and the variable delay means 50 delays the transmission signal received based on code data 64s outputted by the counter 64.

Next, the fifth means for achieving the above objects will be shown.

In an aspect of the phase detection means, with regard to both logic states of the delayed pulse signal 50s and the retiming signal 60s, which is an output of the flip-flop 60, the phase detection means is an XOR gate 62 for supplying a count-up signal to the counter 64 if both logic states are different, whereas supplying a countdown signal to the counter 64 if both the logic states are the same.

Next, the sixth means for achieving the above objects will be shown.

In an aspect of the delay amount of the variable delay means 50, it has at least a variable delay amount in response to the period time of the clock.

Next, the seventh means for achieving the above objects will be shown.

In an aspect of the delay amount of the variable delay means 50, it has at least one half of a variable delay amount in response to period time of the clock, if it is considered that the phase relation is in a phase state where the phase of the delayed pulse signal 50s is later or earlier than the clock.

Next, the eighth means for achieving the above objects will be shown.

In an aspect of the counter 64, it includes a count-enable input terminal en for holding an output code of the counter by enabling counting operation of the counter if a phase adjustment mode to adjust the phase indicates assertion, whereas disabling the counting operation of the counter if the phase adjustment mode indicates negation.

Next, the ninth means for achieving the above objects will be shown. Here, FIGS. 2 and 3 show the means for achieving the above objects according to this invention.

In order to solve the above problems, a phase adjustment apparatus for transmitting a transmission signal synchronized with a clock between a first apparatus of a sending end and a second apparatus of a receiving end includes variable delay means 50 inserted into a line through which the transmission signal is transmitted from the first apparatus to the second apparatus, continuous pulse signal generating means for generating a continuous pulse signal which is alternately inverted while synchronized with the clock from the first apparatus, and phase controlling means for supplying code data to control a delay amount to the variable delay means 50 based on a delayed pulse signal 50s, which results from receiving the continuous pulse signal via the variable delay means 50, and a retiming signal 60s which results from performing retiming of the delayed pulse signal 50s with a clock of the receiving end.

Next, the tenth means for achieving the above objects will be shown. Here, FIG. 5 shows the means for achieving the above objects according to this invention.

In order to solve the above problems, a phase adjustment apparatus for transmitting a transmission signal synchronized with a clock between a first apparatus of a sending end and a second apparatus of a receiving end includes variable delay means inserted into a line through which the transmission signal is transmitted from the first apparatus to the second apparatus, continuous pulse signal generating means for generating a continuous pulse signal which is alternately inverted while synchronized with the clock from the first apparatus, semi-fixed delay means 55 for receiving a clock of the receiving end and outputting a delay clock CLK2b delayed by a predetermined amount, and phase controlling means for supplying code data 64s to control a delay amount to the variable delay means 50 based on a delayed pulse signal 50s, which results from receiving the continuous pulse signal via the variable delay means 50, and a retiming signal 60s which results from performing retiming of the delayed pulse signal 50s with the delay clock.

Next, the eleventh means for achieving the above objects will be shown. Here, FIG. 5 shows the means for achieving the above objects according to this invention.

In an aspect of the semi-fixed delay means 55, it is provided as many as one for the second apparatus of the receiving end having a plurality of channels.

Next, the twelfth means for achieving the above objects will be shown. Here, FIG. 2 shows the means for achieving the above objects according to this invention.

In an aspect of the continuous pulse signal generating means, it includes a flip-flop 32 for receiving an output from a multiplexer 30 provided on a previous stage thereof and supplying the transmission signal on which retiming has been performed with the clock of the receiving end to the second apparatus side and the multiplexer 30 for supplying a signal to be transmitted from the first apparatus of the sending end to an input terminal of the flip-flop 32 on a normal occasion, whereas supplying a reflection output signal of the flip-flop 32 to the flip-flop 32 in case of a phase adjustment mode to generate the continuous pulse signal.

Next, the thirteenth means for achieving the above objects will be shown. Here, FIG. 4 shows the means for achieving the above objects according to this invention.

In an aspect of the continuous signal generating means, it generates the continuous pulse signal by controlling an internal circuit 10 of the first apparatus of the sending end, so that the continuous pulse signal can be generated continuously for a specified time interval with regard to a signal transmitted from the internal circuit 10.

Next, the fourteenth means for achieving the above objects will be shown.

In an aspect of the continuous signal generating means, it generates a continuous pulse signal for phase adjustment from the first apparatus of the sending end at the time of the phase adjustment mode.

Next, the fifteenth means for achieving the above objects will be shown.

In an aspect of the transmission signal, it is a transmission signal of a signal transmission type or a differential transmission type of a connection line which is coupled between the first apparatus of the sending end and the second apparatus of the receiving end.

Next, the sixteenth means for achieving the above objects will be shown.

In an aspect of the phase adjustment apparatus, it is configured to be integrated in an LSI together with the second apparatus.

Next, the seventeenth means for achieving the above objects will be shown.

In an aspect of the connection line 300 of the transmission signal coupled between the first apparatus of the sending end and the second apparatus of the receiving end, it is a wiring pattern on a board, a wiring pattern coupled between separated apparatuses or a cable coupled between coupled between separated apparatuses.

Next, the eighteenth means for achieving the above objects will be shown. Here, FIGS. 2 and 6 show the means for achieving the above objects according to this invention.

A semiconductor test apparatus for transmitting a transmission signal between apparatuses or circuits while synchronizing the signal with a clock includes the phase adjustment apparatus above.

Next, the eighteenth means for achieving the above objects will be shown, Here, FIGS. 2 and 6 show the means for achieving the above objects according to this invention.

The above semiconductor test apparatus includes a configuration for performing phase adjustment on the transmission signal transmitted between apparatuses such an LSI while synchronized with a high-speed clock.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
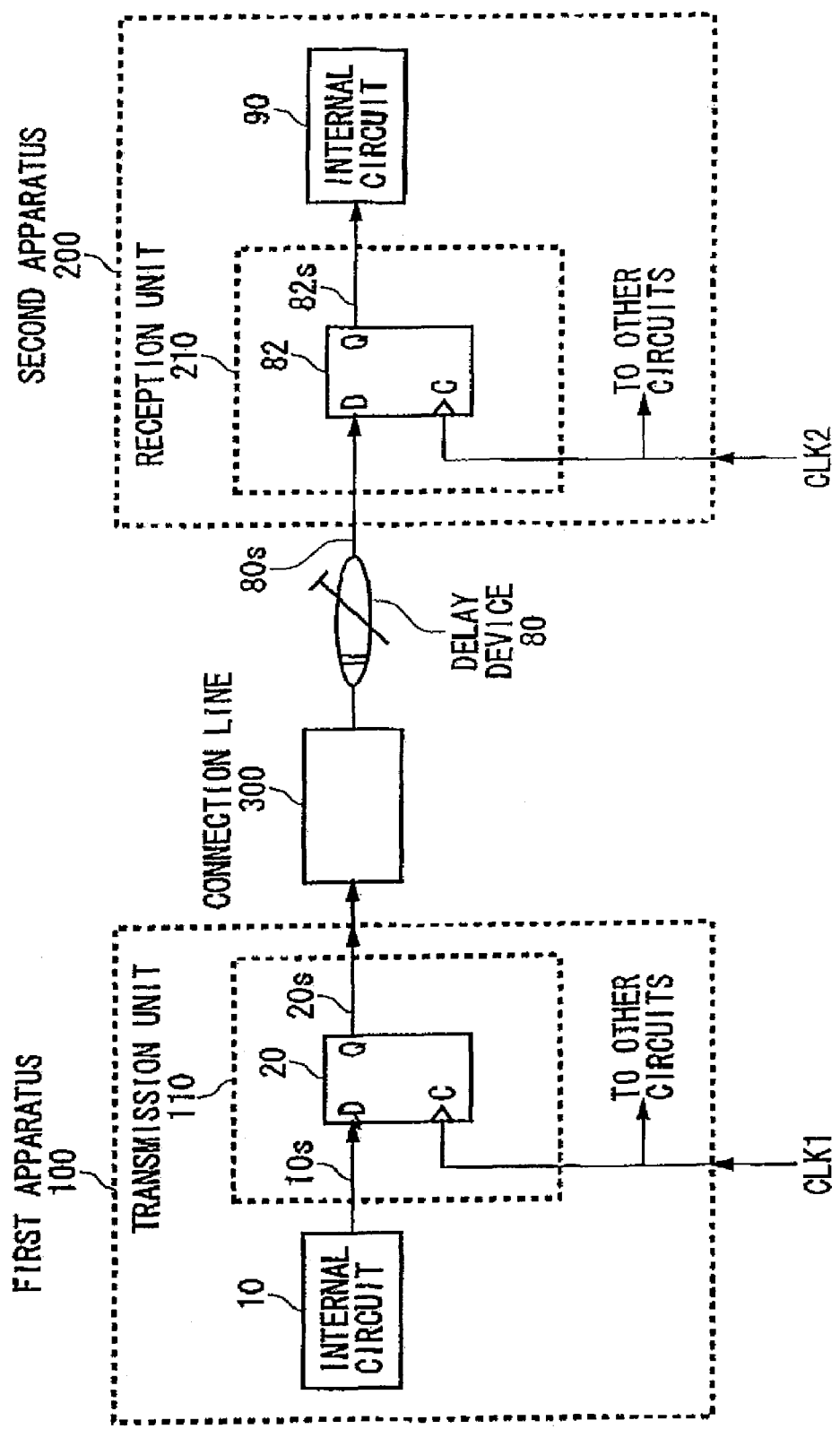
FIG. 1 shows a configuration example of a conventional phase adjustment apparatus of a transmission signal for performing a phase adjustment of timing for a clock.
Figure 2:
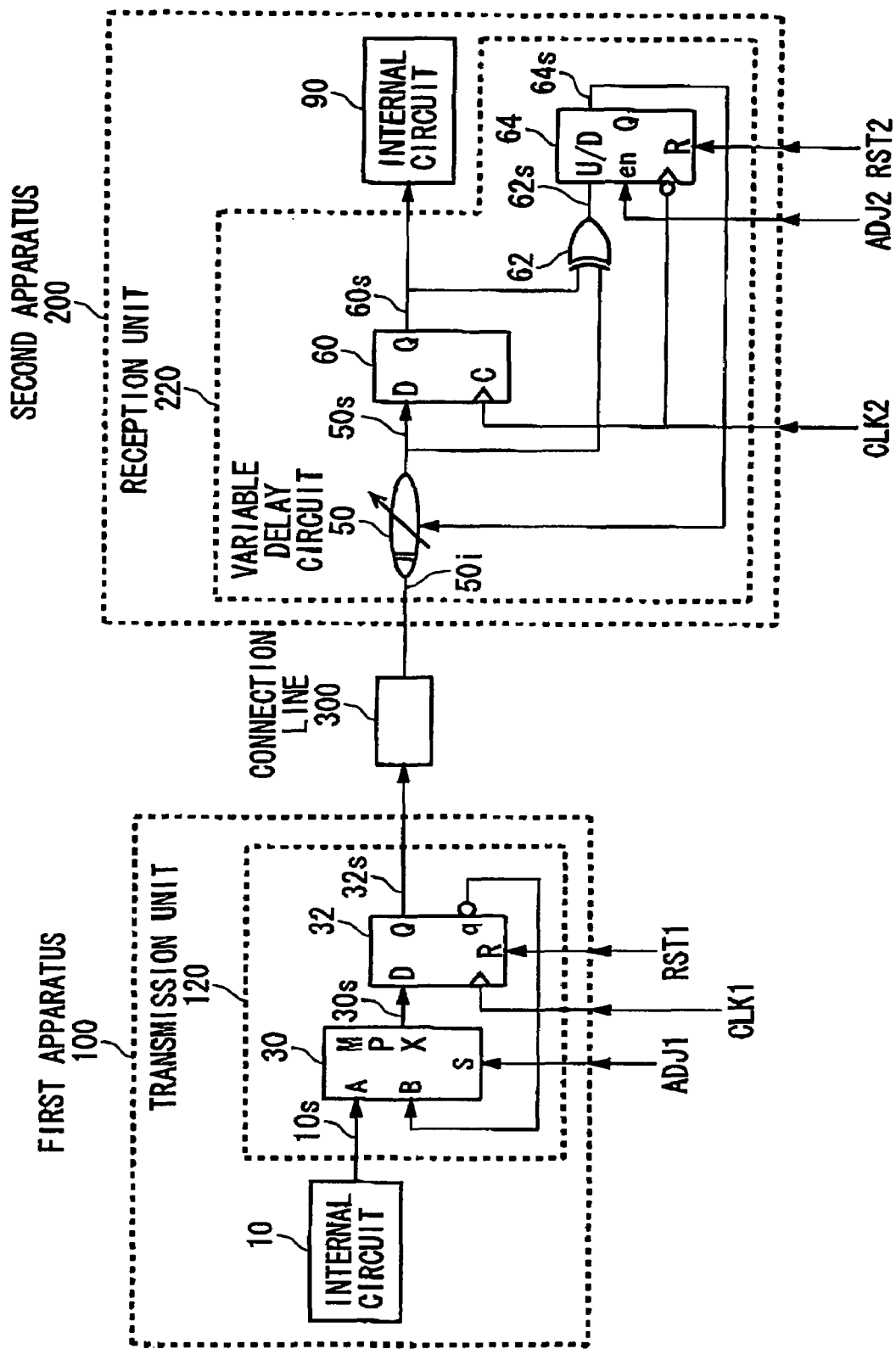
FIG. 2 shows a configuration example of a phase adjustment apparatus of a transmission signal for performing a phase adjustment of timing for a clock according to this invention.

The present invention will hereafter be described referring to FIGS. 2 and 3. Further, elements in response to the conventional configuration are given the same symbols, and matters repeated will not be described.

FIG. 2 shows a configuration example of a phase adjustment apparatus of a transmission signal for performing a phase adjustment of timing for a clock according to this invention. It is herein simply assumed that one transmission signal is received and retiming is performed on the signal with a clock.

These main configuration elements include a first clock CLK1, a second clock CLK2, adjustment mode signals ADJ1 and ADJ2, reset signals RST1 and RST2, a first apparatus 100, a connection line 300, and a second apparatus 200.

A transmission unit 120 of the first apparatus 100 includes a multiplexer 30, a flip-flop 32 so as to realize continuous pulse generating means. Accordingly, at the time of the adjustment mode, a transmission signal (continuous pulse) 32s synchronized with the first clock CLK1 can be generated. Further, these circuits are provided in an LSI, so that their application can be easy.

Firstly, the multiplexer 30 supplies an input signal 10s from an internal circuit 10 to an input terminal D of the flip-flop 32 as its normal signal transmission operation, when the adjustment mode signal ADJ1 is a low level.

Secondly, when the adjustment mode signal ADJ1 is a high level, the multiplexer 30 supplies a q signal of an inverse output terminal of the flip-flop 32 to the input terminal D of the flip-flop 32 as its continuous clock generating operation. As the result, the signal which is inversed from its previous state is inputted, so the continuous pulse for phase adjustment can be generated.

The flip-flop 32 outputs the transmission signal 32s which results from performing retiming of the signal 30s of the input terminal D with the first clock CLK1, and supplies it to the second apparatus 200 through the connection line 300. As the result, when the adjustment mode signal ADJ1 is a high level, as shown by the delayed pulse signal 50s in FIG. 3, a continuous clock signal can be generated. Further, the reset signal RST1 received at the reset input terminal R of the flip-flop is to prevent the possibility that a useless impulse occurs during switching of the adjustment mode signal ADJ1, but no practical problem occurs without it.

The reception unit 220 of the second apparatus 200 includes variable delay means 50, a flip-flop 60, an XOR gate 62, and a counter 64. Further, these circuits are provided in an LSI, whereby their application can be easy.

The variable delay means 50 which is a well-known variable delay circuit outputs the delayed pulse signal 50s which results from delaying the input pulse 50i received through the connection line 300, coming from the transmission signal 32s, based on the code data 64s of a specified complex bit. For example, the delay can be performed up to 1.5 nano seconds by the code data 64s of 5 bits with a resolution of 0.05 nano seconds.

The entire amount of the variable delay needs to have at least one half of the clock period. For example, if the clock period of the second clock CLK2 is 2 nano seconds, it has at least the delay amount of 1.0 nano seconds which is one half of the clock period. Further, although the propagation delay amount between the input and output terminals of the variable delay means 50 itself changes depending upon the change of the surrounding temperature, the phase adjustment can be performed in the optimal state under the present surrounding temperature, so it does not cause any practical problems.

The flip-flop 60 receives the transmission signal 32s via the variable delay means 50 and supplies the retiming signal 60s on which retiming has been performed with the second clock 2 to the internal circuit 90 as well as to one input terminal of the XOR gate 62.

The XOR gate 62 supplies a counter control signal 62s to allow the counter 64 to perform increment or decrement operation. That is, it supplies a high level so as to allow the counter 64 to perform the increment operation, if the levels of the delayed pulse signal 50s and the retiming signal 60s are different, whereas supplying a low level so as to allow the counter 64 to perform the decrement operation, if the levels of the delayed pulse signal 50s and the retiming signal 60s are the same.

The counter 64 is an UP/DOWN type of 5 bit width with an enable input terminal en, and it receives the counter control signal 62s at its U/D input terminal and performs count-up or countdown operation at the timing of the falling edge of the second clock CLK2.

The adjustment mode signal ADJ2 is supplied to the enable input terminal en. Firstly, when the adjustment mode signal ADJ2 is a high level, which indicates that automatic phase adjustment operation is performed, the counter 64 receives the continuous pulse signal 32s for the automatic phase adjustment and performs specified counting operation on it, and then the phase state in which the phase is automatically adjusted comes in a short time which is approximately a few clocks, and the convergence operation is repeated at ±1 before and after its code value. Secondly, when the adjustment mode signal ADJ2 is a low level, which indicates the normal signal transmission operation, the counter 64 functions as a holing register for holding the code value of the phase state in which the phase is automatically adjusted.

The reset signal RST2, ahead of the start of the automatic phase adjustment, is supplied to the reset input terminal R of the counter 64 in the form of an impulse and provides the initial value of the start of the automatic phase adjustment. As the initial code value, it is preferably close to the intermediate value of the entire delay amount. For example, if it is assumed that the 5 bit-code of "00000" indicates 0 nano second while "11111" indicates 1.5 nano seconds, the code value of approximately 0.8 nano seconds represented by "10000" which is close to the intermediate value is used as the initial code value. Therefore, the MSB of the 5 bit-code is supplied to the variable delay means 50 in the form of an inverted output signal or being inverted by an inverter (not shown).

Next, description continues referring to a timing chart from the start of the automatic phase adjustment (automatic correction) to the convergence state shown in FIG. 3.

Figure 3A:
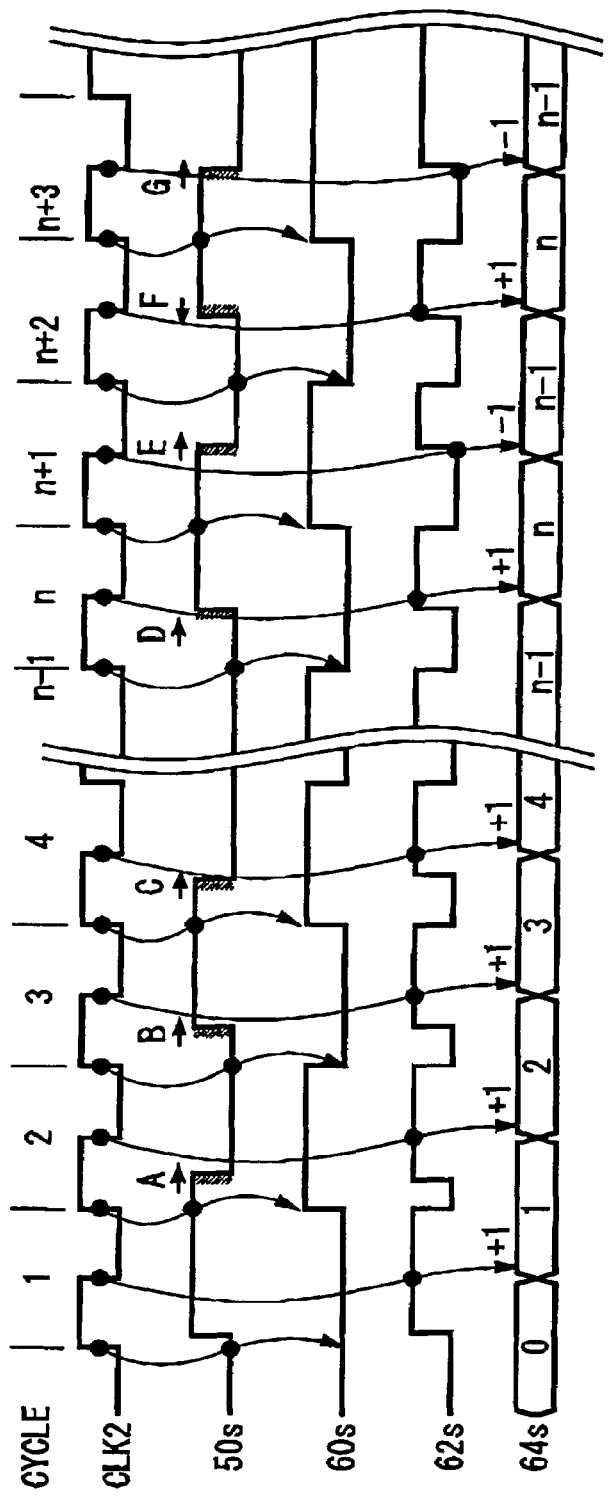
FIG. 3 shows a timing chart from the start of the automatic phase adjustment (automatic correction) to a convergence state, while depicting the operation in FIG. 2.
Figure 3C:
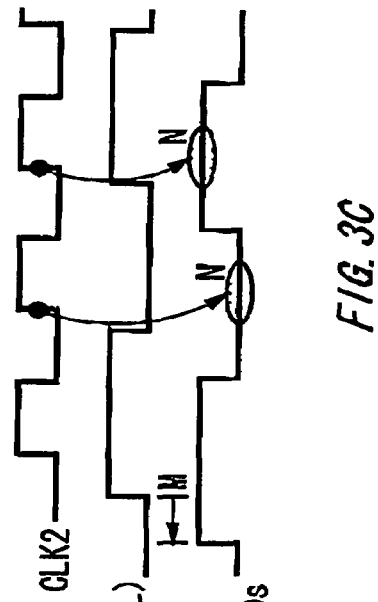
Figure 3B:
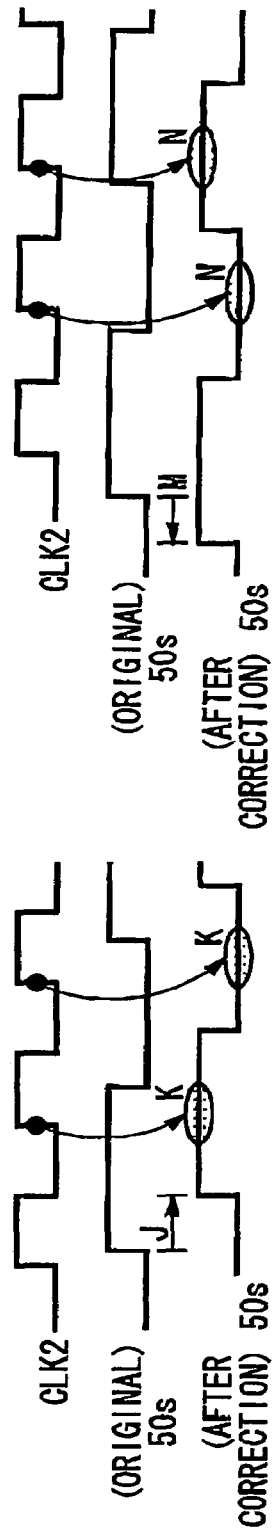

FIG. 3A shows the delayed pulse signal 50s which is delayed by the timing of a phase amount J from the aimed phase state as shown in FIG. 3B.

The timing chart in FIG. 3A shows the automatic phase adjustment right after the code value of "0" which results from resetting the code data 64a is set by the reset signal RST2 into the initial state. At the time of the start, it is assumed that the phase position of the continuous delayed pulse signal 50s exists in the phase position shown in the drawing.

In this case, the phase position to be adjusted, as shown in FIG. 3B, is preferably adjusted in order that the center section K of the delayed pulse signal 50s comes at the rising edge of the second clock CLK2. Accordingly, it is necessary to shift the phase amount J against the initial state shown in FIG. 3B. Therefore, it is necessary to operate in order that the automatic phase adjustment is performed to count down the counter 64.

First, in the first cycle shown in FIG. 3A, the delayed pulse signal 50s is latched and outputted at the rising edge of the second clock CLK2, and the counter control signal 62s of the XOR gate 62 becomes a high level at the rising edge of the second clock CLK2 so as to perform the increment operation. Consequently, the code data 64s becomes "1". The delayed pulse signal 50s (see A in FIG. 3) on which its delay has been a little increased by the variable delay means 50 receiving the signal is supplied to the input terminal D of the flip-flop 60.

In the next second cycle, the counter control signal 60s of the XOR gate 62 becomes the high level at the falling edge of the second clock CLK2 in the same way as above so as to perform the increment operation. Consequently, the code data 64s becomes "2". The delayed pulse signal 50s (see B in FIG. 3) on which its delay has been further a little increased by the variable delay means 50 receiving the signal is supplied to the input terminal D of the flip-flop 60.

Also from the following third cycle to the n-th cycle, the counter control signal 60s of the XOR gate 62 becomes the same high level so as to perform increment operation, and the code data 64s proceeds to be "3", "4", ..., "n−1", "n" (see C, D and E in FIG. 3).

Next, in the n+1-th cycle, since the counter control signal 60s of the XOR gate 62 changes into a low level at the timing of the falling edge of the second CLK2, it performs the decrement operation. Consequently, the code data 64s turns into "n−1" from n Consequently, the delayed pulse signal 50s (see F in FIG. 3) on which its delay has been a little decreased by the variable delay means 50 is supplied to the input terminal D of the flip-flop 60.

Next, in the n+2-th cycle, since the counter control signal 60s of the XOR gate 62 changes into a high level at the timing of the falling edge of the second CLK2, it performs the increment operation. Consequently, the code data 64s turns into "n" from "n−1". The delayed pulse signal 50s (see G in FIG. 3) on which its delay has been a little increased by the variable delay means 50 receiving this signal is supplied to the input terminal D of the flip-flop 60.

In the following cycles, the operation of repeating the n+1-th and n+2-th cycles is performed. Further, since the counter control signal 62s of the XOR gate 62 performs the increment or decrement operation at the barely timing, a timing deviation of one cycle might occur. Accordingly, although the phase deviation as much as ±1 count might occur at the timing of adjustment completion when the adjustment mode signal ADJ2 turns into a low level from a high level, a sufficient phase adjustment can be practically realized.

As the result, the phase adjustment is performed in order that the center section K of the delayed pulse signal 50s comes at the rising edge of the second clock CLK2, as shown in FIG. 3B. Consequently, in the receiving end, a considerable advantage that the transmission signal can be received at the stable and optimal timing is obtained.

Next, an example shown in FIG. 3C indicates that the original delayed pulse signal 50s is ahead of the aimed phase state by the timing of a phase amount M.

In this case, with regard to the description of the timing chart of FIG. 3A, the counter control signal 62s of the XOR gate 62 becomes a low level so as to start to perform the decrement operation. Accordingly, matters except the start from decrement operation are the same as the above description, so they will not be described. Also in the convergence state of this case, the phase adjustment is performed in order that the center section N of the phase of the delayed pulse signal 50s corresponds to the rising edge of the second clock CLK2. Accordingly, as shown in FIG. 3C, the automatic phase adjustment is performed on the original delayed pulse signal 50s at the timing position of the front side of the phase amount M.

Consequently, the phase adjustment is performed in order that the center section N of the delayed pulse signal 50s comes at the rising edge of the second clock CLK2 as shown in FIG. 3C. Consequently, at the receiving end, a considerable advantage that the transmission signal can be received at the stable and optimal timing is obtained. Accordingly, retiming can be performed on the set-up time or hold time with the second clock CLK2 under the stable timing condition. And even if the jitter or waveform distortion caused by the reflection of the transmission signal exists, retiming is performed at the center section N of the delayed pulse signal 50s, so that stable operation can be performed.

According to the above configuration, although the phase state of all of the original delayed pulse signal 50s, i.e. phase relation between the transmission signal received in the receiving end and the clock of the receiving end performing this signal is in an unknown state, the delay amount of the variable delay means 50 is set in a state where the propagation delay of the transmission signal is automatically corrected in order that the signal can be received at the stable and optimal timing, whereby a considerable advantage that a phase adjustment apparatus capable of receiving the transmission signal under the stable and optimal condition can be realized is obtained. The reliability of the circuit's operation can be improved for each stage.

In addition, since the automatic phase adjustment can be performed at any time after a power supply is applied, a considerable advantage to perform adjustment into the optimal phase relation is obtained regardless of various phase change factors by which the phase relation between both of them is changed such as a power supply voltage condition, surrounding temperature condition, board replacement of the first or second apparatus or a clock supply, etc.

Further, even if the clock period is changed and applied, the automatic phase adjustment is performed after the change of the clock period, so that stable operation is possible.

Further, although the present invention has been described by way of exemplary embodiments, it should be understood that those skilled in the art might make many changes and substitutions without departing from the spirit and the scope of the present invention, which is defined only by the appended claims.

For example, although the transmission signal is in the form of the single transmission in this embodiment, also in case of a transmission signal of a differential transmission type, the differential transmission type is changed into the single transmission type at the reception terminal, whereby the above description can be applied in the same way.

Figure 4:
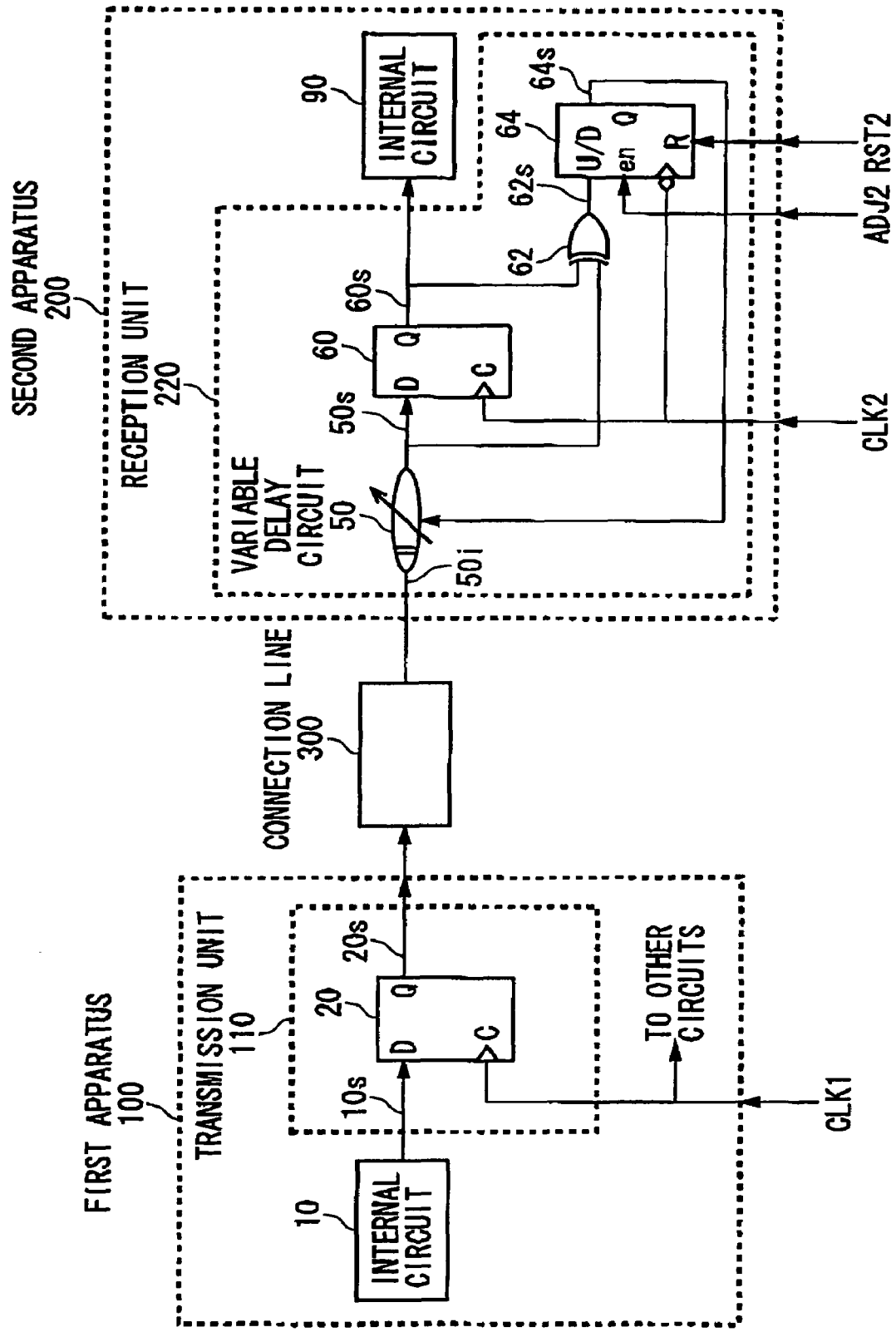
FIG. 4 shows another configuration example of a phase adjustment apparatus of a transmission signal for performing a phase adjustment of timing for a clock according to this invention.

And if continuous pulses of approximately a few tends of pulses needed until convergence can be controlled to be generated from the internal circuit 10 of the first apparatus, as shown in an configuration example shown in FIG. 4, it is unnecessary to provide the transmission unit 210 as well as the adjustment mode signal ADJ1 and the reset signal RST1 shown in FIG. 2 inside the first apparatus.

And a phase adjustment apparatus of a transmission signal, where it is considered that the phase relation between the second clock CLK2 and the delayed pulse signal 50s is always the phase relation as shown in FIG. 3B, performs only the increment operation, so that it may be configured to optionally decrease the entire delay amount of the variable delay means 50 into one half of it. In this case, an advantage to reduce the circuit size of the variable delay means 50 into one half is obtained.

On the contrary, a phase adjustment apparatus of a transmission signal, where it is considered that the phase relation between the second clock CLK2 and the delayed pulse signal 50s is always the phase relation as shown in FIG. 3C, performs only the decrement operation, so that it may be configured to optionally decrease the entire delay amount of the variable delay means 50 to one half of it. Also in this case, an advantage to reduce the circuit size of the variable delay means 50 into one half is obtained.

Figure 5:
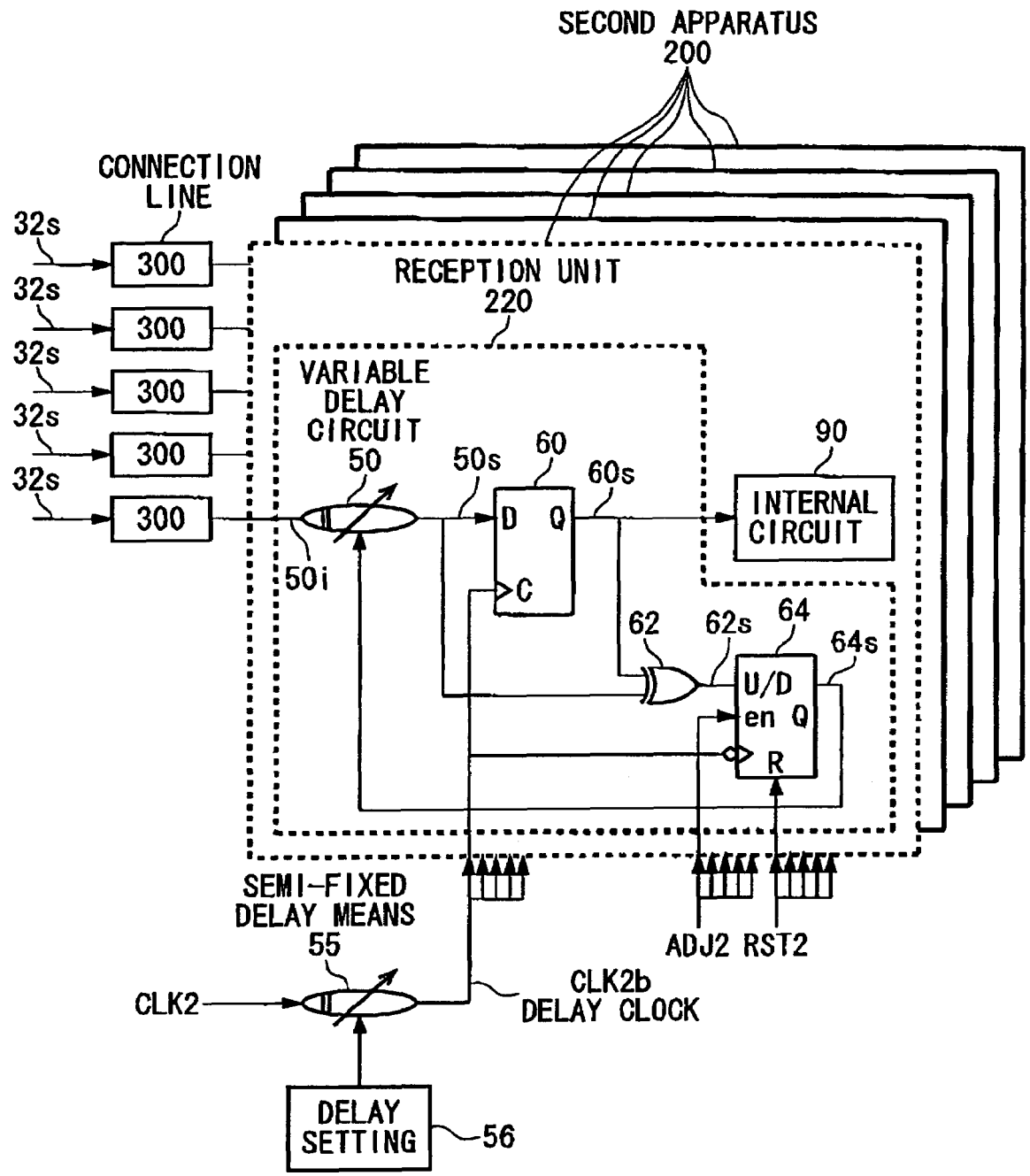
FIG. 5 shows another configuration example of a phase adjustment apparatus of a transmission signal for performing a phase adjustment of timing for a clock according to this invention.
Figure 6:
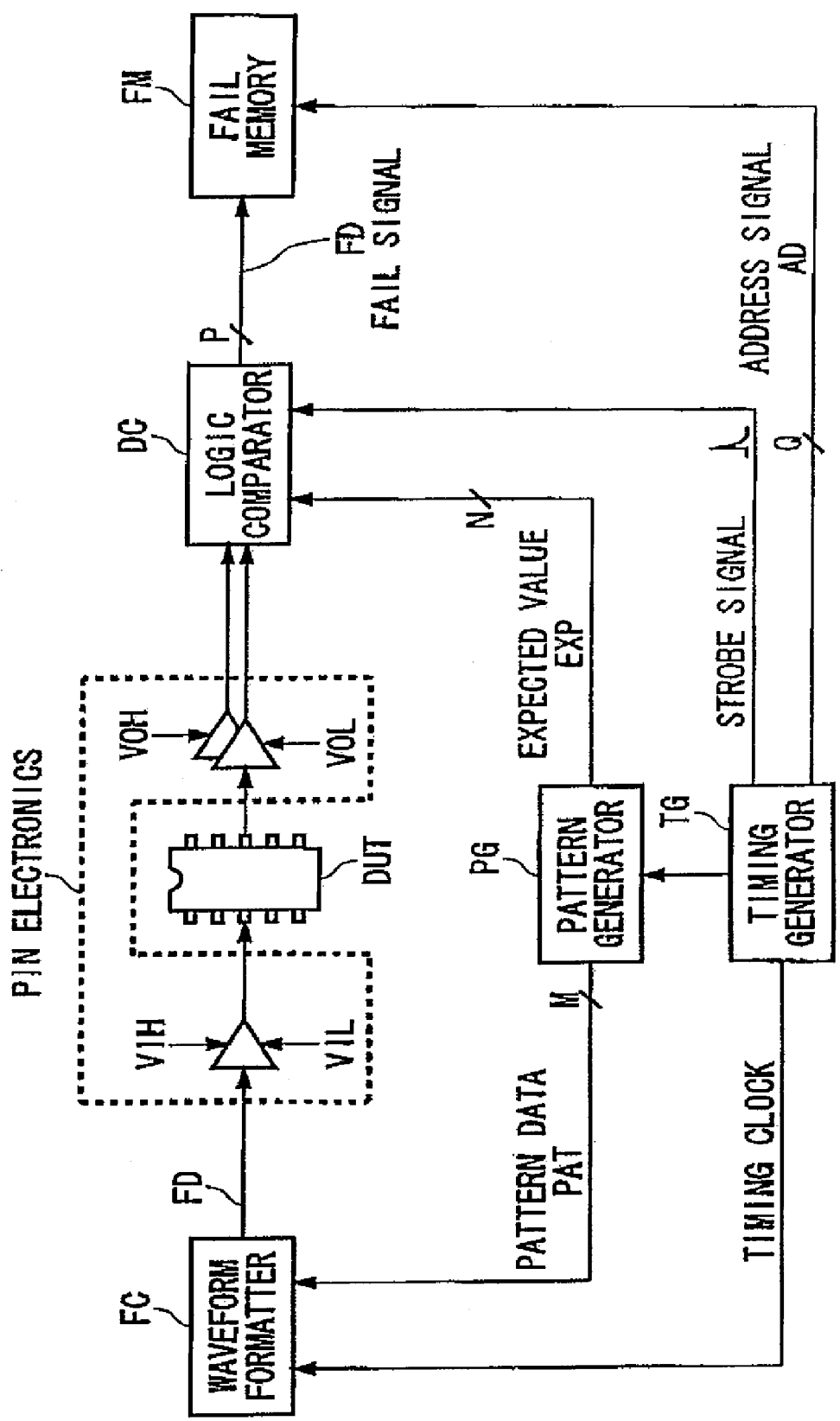
FIG. 6 shows the representative schematic configuration of a semiconductor test apparatus.

And as shown by another example in FIG. 5, this invention can be also realized by configuration means of adding and inserting semi-fixed delay means 55 to the second clock 2 used in common by the configuration of second apparatuses 200 of a plurality of channels each of which performs the phase adjustment. The configuration means is effective if the delay errors of the connection lines 300 of a plurality of channels are similar.

The variable delay amount of the variable delay means 50 of each channel is small as much as one half, and the phase of the delay clock CLK2b itself used in common for retiming is adjusted by controlling to set the delay amount of the semi-fixed delay means 55 for the second clock CLK2.

Accordingly, the variable delay means 50 of one side is mainly for the adjustment of delay irregularity between the connection lines 300, whereas the semi-fixed delay means 55 of the other side is mainly for the correction of the factors by which the phase deviates in common for the entire channels. Here, as the factors by which the phase deviates in common for the entire channels, there are the power supply voltage condition, the surrounding temperature condition, the board replacement of the first or second apparatus or a clock supply, etc.

Accordingly, since the variable delay amount of the variable delay means 50 provided with a plurality of channels can be reduced, the circuit size can be reduced and the apparatus can be configured at lower cost.

Further, a retrieving circuit for retrieving the code data 64s of one of the channels may be provided so as to control the setting of the semi-fixed delay means 55 in order that the delay amount of the variable delay means 50 can be converged near the center.

This invention performs the effects present below from the above description.

As obvious from the description above, according to the present invention, although the phase relation between the second clock CLK2 of the receiving end, which receives the transmission signal 32s from the first apparatus and performs retiming of the signal, and the flip-flop 60 is in an unknown state, a phase adjustment apparatus of the transmission signal capable of automatically correcting the phase relation between both of them in order that the signal can be received at stable and optimal timing can be realized. Therefore, the reliability of circuit operation can be improved for each stage.

And since the automatic phase adjustment can be performed at any time after a power supply is applied, a considerable advantage to perform adjustment into the optimal phase relation is obtained regardless of various phase change factors by which the phase relation between both of them is changed such as a power supply voltage condition, surrounding temperature condition, board replacement of the first or second apparatus or a clock supply, etc.

Therefore, the technical effects as well as the economical effects on industries of this invention are significant.

What is claimed is:

1. A phase adjustment apparatus for transmitting a transmission signal synchronized with a clock between a first apparatus of a sending end and a second apparatus of a receiving end, comprising;

variable delay means inserted into a line through which said transmission signal is transmitted from said first apparatus to second apparatus;

continuous pulse signal generating means for continuously generating pulse signals which are alternately inverted while synchronized with said clock from said first apparatus; and phase controlling means for supplying code data to control a delay amount to said variable delay means based on delayed pulse signals, which result from receiving said continuously generated pulse signals via said variable delay means, and on retimed signals, which result from performing retiming of said delayed pulse signals with clock of said receiving end, wherein said continuous pulse signal generating means comprises:

a flip-flop for receiving an output from a preceding multiplexer and supplying said transmission signals, on which retiming has been performed with said clock of said first apparatus, to said second apparatus; and said multiplexer for supplying a signal to be transmitted from said first apparatus of said sending end to an input terminal of said flip-flop on a normal operation mode, and for supplying an inverted output signal from said flip-flop to an input terminal of said flip-flop on a phase adjustment mode in which said continuously pulse signals are generated.

2. A phase adjustment apparatus for transmitting a transmission signal synchronized with a clock between a first apparatus of a sending end and a second apparatus of a receiving end, comprising;

variable delay means inserted into a line through which said transmission signal is transmitted from said first apparatus to second apparatus;

continuous pulse signal generating means for continuously generating pulse signals which are alternately inverted while synchronized with said clock from said first apparatus;

semi-fixed delay means for receiving a clock of said receiving end and outputting a delay clock delayed by a predetermined amount; and phase controlling means for supplying code data to control a delay amount to said variable delay means based on delayed pulse signals, which result from receiving said continuously generated pulse signals via said variable delay means, and on retimed signals, which result from performing retiming of said delayed pulse signals with said delay clock, wherein said continuous pulse signal generating means comprises:

a flip-flop for receiving an output from a preceding multiplexer and supplying said transmission signals, on which retiming has been performed with said clock of said first apparatus, to said second apparatus; and said multiplexer for supplying a signal to be transmitted from said first apparatus of said sending end to an input terminal of said flip-flop on a normal operation mode, and for supplying an inverted output signal from said flip-flop to an input terminal of said flip-flop on a phase adjustment mode in which said continuously pulse signals are generated.

3. The semiconductor test apparatus for transmitting a transmission signal between apparatuses or circuits while synchronizing said signal with a clock, comprising said phase adjustment apparatus as claimed in claim 1.

4. The semiconductor test apparatus for transmitting a transmission signal between apparatuses or circuits while synchronizing said signal with a clock, comprising said phase adjustment apparatus as claimed in claim 2.

* * * * *